United States Patent [19]

Degenhardt

[11] Patent Number: 5,375,190
[45] Date of Patent: Dec. 20, 1994

[54] METHOD AND CIRCUIT CONFIGURATION FOR NON-LINEAR LINKAGE OF TWO BINARY WORDS

[75] Inventor: Achim Degenhardt, München, Germany

[73] Assignee: Siemens Aktiengesellschaft, Munich, Germany

[21] Appl. No.: 126,110

[22] Filed: Sep. 21, 1993

Related U.S. Application Data

[63] Continuation-in-part of Ser. No. 847,793, Mar. 6, 1992, abandoned.

[30] Foreign Application Priority Data

Mar. 7, 1991 [EP]  European Pat. Off. ............ 91103520

[51] Int. Cl.⁵ ............................................. G10L 9/00
[52] U.S. Cl. ................................... 395/2.38; 395/2.1
[58] Field of Search ................. 395/2, 2.1, 2.38; 364/757, 748.5, 722, 715.01–715.08; 341/50, 75, 138, 139

[56] References Cited

U.S. PATENT DOCUMENTS 4,521,764  6/1985  Burton ............................. 340/347
4,566,076  1/1986  van der Steen .................. 364/757

FOREIGN PATENT DOCUMENTS 58-145216  11/1983  Japan .
0633017  11/1978  U.S.S.R. ..................... G06F 7/38

OTHER PUBLICATIONS

Hewlett–Packard Journal, vol. 31, No. 1, Jan. 1980, Palo Alto, USA pp. 10–11; "A Digital Attenuator with 1-dB Steps".

*Primary Examiner*—Allen R. MacDonald
*Assistant Examiner*—Michelle Doerrler
*Attorney, Agent, or Firm*—Herbert L. Lerner; Laurence A. Greenberg

[57] ABSTRACT

In a method and circuit configuration for non-linear linkage of two binary words, a first method step is performed by shifting a first binary word to the right by a number of places associated with the first method step, and adding the unchanged first binary word thereto. N—2 further method steps are performed by shifting an outcome of addition of a preceding method step to the right by one place and by a number of places in respective method steps, and adding the unchanged first binary word thereto. A final method step is performed by shifting the outcome of the addition of the preceding method step to the right by one place and by a number of places associated with the final method step. A second binary word is split into n sub-binary words, and the numbers of places associated with the various method steps each correspond to one sub-binary word.

9 Claims, 2 Drawing Sheets

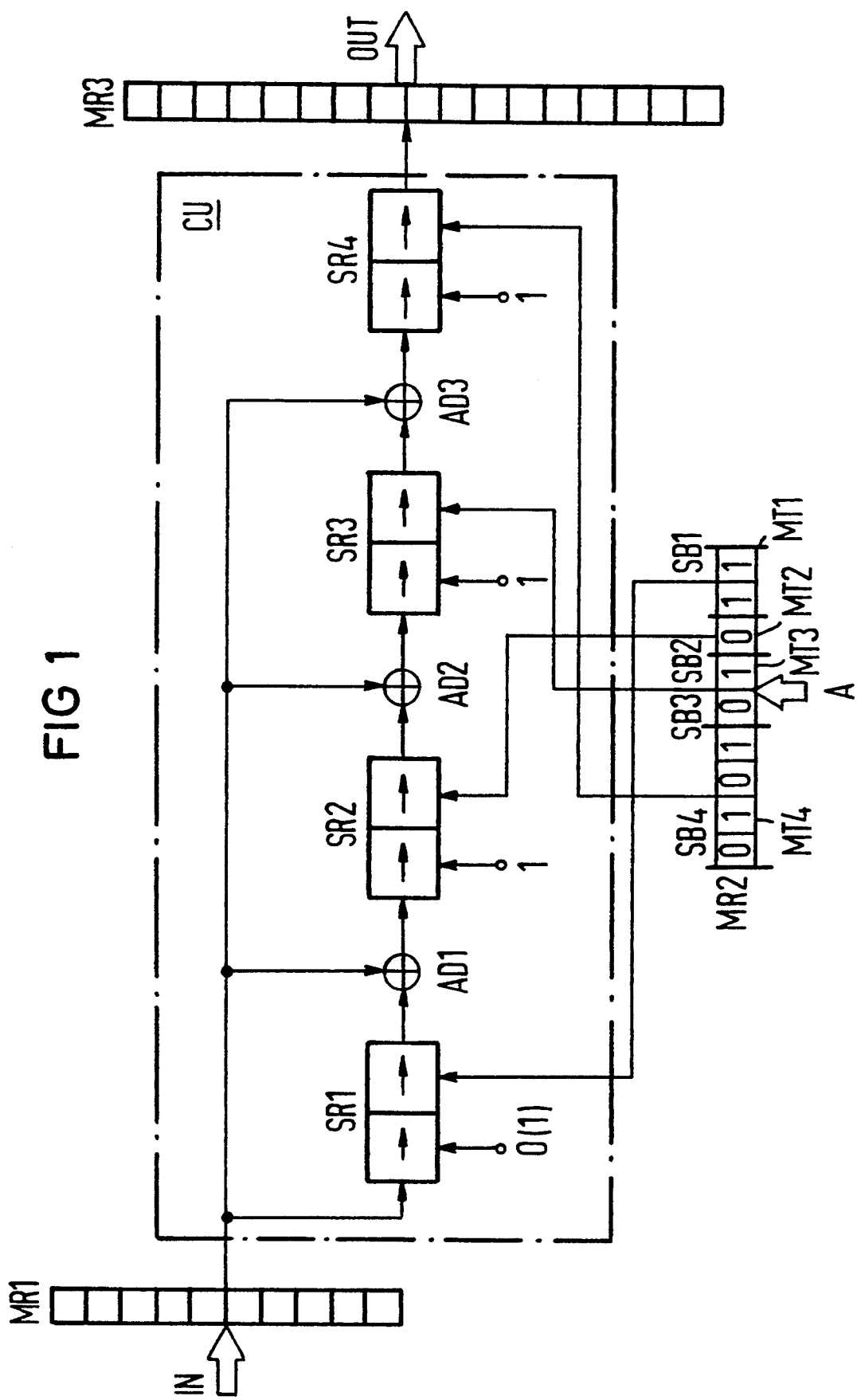

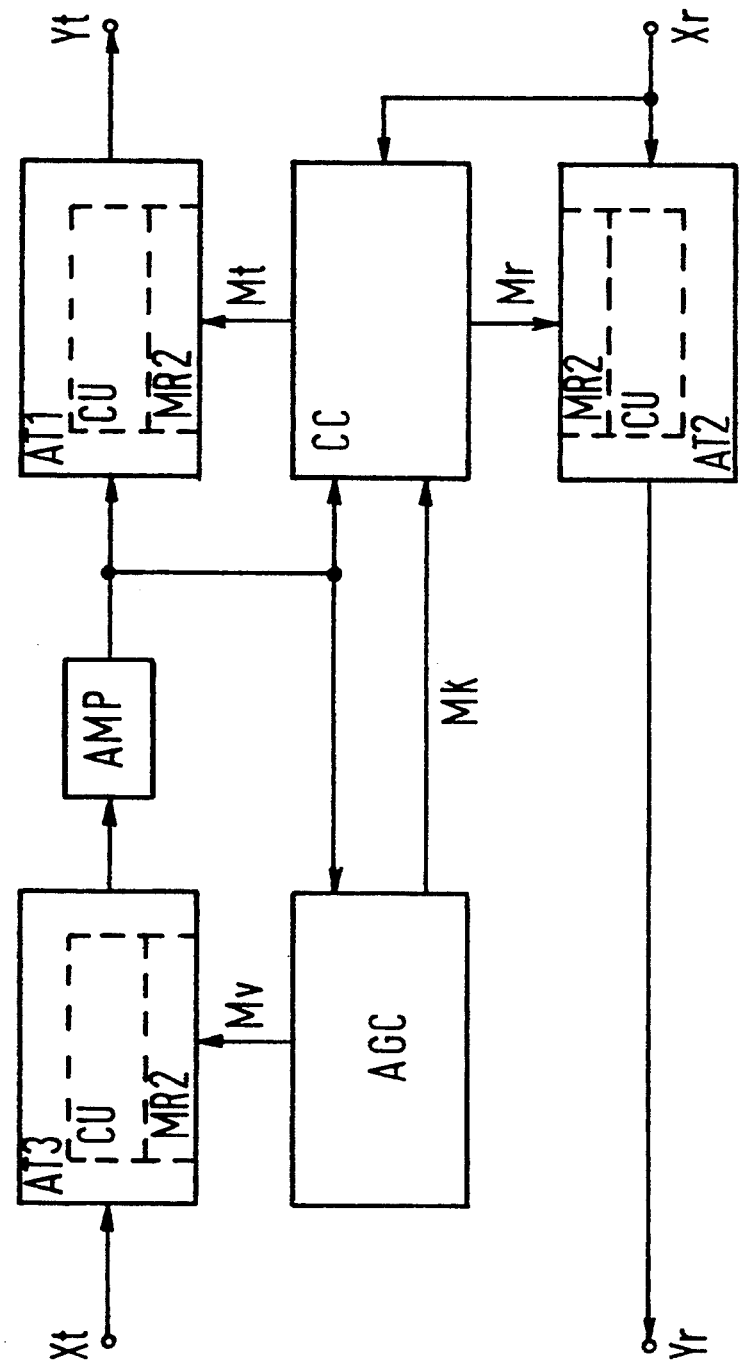

METHOD AND CIRCUIT CONFIGURATION FOR NON-LINEAR LINKAGE OF TWO BINARY WORDS

This application is a continuation of application Ser. No. 07/847,793, filed Mar. 6, 1992 now abandoned.

The invention relates to a method and a circuit configuration for non-linear linkage of two binary words.

In many areas of digital signal processing, discrete-time signals, which represent a sequence of binary words, have to be linked non-linearly to one another. Particularly in digital speech signal processing, because of the non-linear and virtually logarithmic behavior of the human ear, it is useful to attenuate a speech signal in non-linear and preferably logarithmic dependency on a control signal, or in other words to adjust the level of attenuation of an attenuation member, for instance, in direct proportion with the control signal. Linking binary words of the speech signal non-linearly to binary words of the control signal presents a problem.

It is accordingly an object of the invention to provide a method and a circuit configuration for non-linear linkage of two binary words, which overcomes the hereinafore-mentioned disadvantages of the heretofore-known methods and devices of this general type.

With the foregoing and other objects in view there is provided, in accordance with the invention, a method for non-linear linkage of two binary words, which comprises performing a first method step by shifting a first binary word to the right by a number of places associated with the first method step, and adding the unchanged first binary word thereto; performing $n-2$ further method steps by shifting an outcome of addition of a preceding method step to the right by one place and by a number of places in respective method steps, and adding the unchanged first binary word thereto, performing a final method step by shifting the outcome of the addition of the preceding method step to the right by one place and by a number of places associated with the final method step, and splitting a second binary word into n sub-binary words, and making the numbers of places associated with the various method steps each correspond to one sub-binary word.

In accordance with another mode of the invention, there is provided a method which comprises placing at least one bit of the second binary word in the sub-binary words; placing only adjacent bits of the second binary word in sub-binary words having more than one bit; and associating the sub-binary words having increasing significance within the second binary word with the place numbers in the order of the associated method steps.

In accordance with a further mode of the invention, there is provided a method which comprises placing two bits in the sub-binary word having the least significance within the second binary word, and setting the number of bits in the other sub-binary words having increasing significance within the second binary word, beginning at 1, each equal to a power of 2.

In accordance with an added mode of the invention, there is provided a method which comprises shifting the first binary word to the right by one further place in the first method step.

With the objects of the invention in view, there is also provided a circuit configuration for non-linear linkage of two binary words, comprising a first register into which a first binary word is written, a second register into which a second binary word is written, the second register having n subregisters including a first subregister, further subregisters and a last subregister, and a computation unit connected to the first register and to the n subregisters, the computation unit initially shifting a first binary word to the right by a number of places stored in the first subregister and adding the first binary word thereto, the computation unit thereupon shifting the applicable preceding outcome of addition to the right by one place and by a number of places stored respectively in the further subregisters $n-2$ times in succession and adding the first binary word thereto, and the computation unit finally shifting a final outcome of addition to the right by one place and by a number of places stored in the last subregister.

In accordance with another feature of the invention, the subregisters are associated with various shifting operations within the second register in accordance with their significance.

In accordance with a further feature of the invention, the subregister having the least significance is two bits wide, and the width of other subregisters, with increasing significance, beginning at 1, is equal to powers of 2.

In accordance with an added feature of the invention, the computation unit initially shifts the first binary word to the right by one further place.

In accordance with a concomitant feature of the invention, the computation unit includes n shift registers and adders through which the n shift registers are connected in series, and the first binary word is delivered to the adders and to a first one of the shift registers.

The advantage of the invention is that the achievement of the method and circuit configuration entails little effort or expense.

Other features which are considered as characteristic for the invention are set forth in the appended claims.

Although the invention is illustrated and described herein as embodied in a method and a circuit configuration for non-linear linkage of two binary words, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

FIG. 1 is a schematic and block circuit diagram of an exemplary embodiment of a circuit configuration according to the invention for performing the method of the invention; and FIG. 2 is a block circuit diagram of an exemplary application for a method of the invention and a circuit configuration of the invention in a hands-free circuit.

Referring now to the figures of the drawing in detail and first, particularly, to FIG. 1 thereof, there is seen an exemplary embodiment in which a computation unit CU is provided that has four shift registers SR1–SR4. Through the use of the shift registers SR2–SR4, binary words written in them are first shifted to the right by one place and then by a number of places corresponding to an associated sub-binary word SB2–SB4. In contrast, in the shift register SR1, shifting to the right is accomplished by a number of places that corresponds only to an associated sub-binary word SB1. The partial or sub-binary words SB1–SB4 are stored in four subregisters MT1–MT4, which together form a register MR2. The splitting of the register MR2 into four subregisters MT1-MT4 is done in such a way that the two least significant bits are assigned to the first subregister MT1, the next higher-value bit is assigned to the subregister MT2, the next two higher-value bits are assigned to the subregister MT3, and the four most significant bits are assigned to the subregister MT4. This means that the sub-binary word SB1 having the least significance within a binary word A has two bits, and the number of bits in the other sub-binary words SB2, SB3, SB4, with increasing significance within the binary word A beginning at 1, is in each case equal to a power of 2. The sub-binary words SB1-SB4, with increasing significance within the binary word A, are assigned the place numbers by which shifting to the right is to be accomplished in each case, in the order of the associated method steps. To this end, the subregisters MT1-MT4 are each connected to control inputs of the respectively associated shift registers SR1-SR4.

The four shift registers SR1-SR4 are connected in series, with the interposition of adders AD1, AD2, AD3. Like the first of the shift registers SR1, the adders AD1, AD2, AD3 are additionally acted upon by a first binary word IN, which is stored in a register MR1. The binary word IN is first shifted to the right by means of the shift register SR1, by a place number stored as the sub-binary word SB1 in the subregister MT1, and for this purpose the binary word IN is added, unchanged, by means of the adder AD1. Alternatively, a fundamental shift to the right by one place may be provided in the shift register SR1 as well. However, for the remaining observations it is assumed that such a provision is rejected. The binary word at the output of the adder AD1 is then stored in the shift register SR2, where it is thereupon shifted to the right by one place and by a place number corresponding to the sub-binary word SB2 and added to the binary word IN by means of the adder AD2. A corresponding method step is subsequently performed with the shift register SR3 and the adder AD3 as well. Finally, the binary word at the output of the adder AD3 is shifted to the right by one place and by a number of places corresponding to the sub-binary word SB4 by means of the shift register SR4 and is written as a binary word OUT into a register MR3, from where it can be read out again for further processing. While the binary words IN and OUT each have a sign bit, the binary word A assumes only positive values and therefore has no sign bit.

In general, a circuit configuration according to the invention having n shift registers can be described mathematically as follows:

$$Y/X = \tfrac{1}{2} * 2^{-R_n} * (1 + \tfrac{1}{2} * 2^{-R_{n-1}} * (1 + \ldots \tfrac{1}{2} * 2^{-R_2} * (1 + 2^{-R_1}) \ldots )) \quad (1)$$

$$G = -20 * \log(Y/X) \quad (2)$$

where Y represents the decimal value of the data word OUT and X represents the decimal value of the data word IN, while $R_1 \ldots R_n$ stands for the applicable number of rightward shifting operations. G stands for the level of attenuation, which is equal to the negative logarithm, multiplied by 20, of the quotient Y/X. Multiplying out equation (1) gives the following result:

$$Y/X = 2^{-R_n - 1} + 2^{-R_n - R_{n-1} - 2} + \ldots + 2^{-R_n - R_{n-1} - R_2 \ldots -(n-1)} + 2^{-R_n - R_{n-1} \ldots R_2 - R_1 - (n-1)} \quad (3)$$

Equation (3) provides proof of the unambiguous nature between the level of attenuation attained and the associated set $R_1 \ldots R_n$ of coefficients describing the shifting operations. It also shows that the quotient Y/X, or the attainable level of attentuation, is between 1 and 0 or between 0 dB and $+\infty$ dB, regardless of the subscript n being selected. As will be demonstrated below, some other minimal attenuation level than 0 dB, for instance, can be attained, for instance by connecting a circuit configuration according to the invention to the input or output side of a circuit unit having constant amplification or constant attenuation.

The set of coefficients $R_1 \ldots R_n$ is recovered from the binary word A. To this end, the binary word A is split into n sub-binary words. To this end, the register MR2 provided for holding the binary word A is, for instance, split into n subregisters. Each of the sub-binary words or subregisters has a definite width, and these may be the same as one another or different, but in each case they amount to at least one bit. The total width of all of the sub-binary words or subregisters gives the width of the sub-binary word A or of the register MR2. A sub-binary word or the content of a subregister is interpreted without a sign as a decimal number. In other words, this decimal number equals the number of places by which shifting rightward is done, or in other words is equal to one of the coefficients of the set of coefficients $R_1 - R_n$.

In the exemplary embodiment of FIG. 1, n=4. The subregisters MT1-MT4, beginning at the lowest-value subregister MT1, have a width of 2, 1, 2 and 4 bits. For instance, if the binary word A equals 010101011, then a value of 11, corresponding to a decimal value of 3, results for the sub-binary word SB1; a value of 0 corresponding to a decimal value of 0 results for the sub-binary word SB2; a value of 01 corresponding to a decimal value of 1 results for the sub-binary word SB3; and a value of 0101, corresponding to a decimal value of 5 results for the sub-binary word SB4. From this it follows that the shift register SR1 shifts the binary word stored in it to the right by three places. In the shift registers SR2, SR3 and SR4, the corresponding binary words are accordingly shifted to the right by one, two and six places, respectively. If the binary word A is altered, then other values also result for the set of coefficients $R_1 \ldots R_4$ for the shift registers SR1-SR4.

The quotient Y/X depends on the particular binary word A stored in the register MR2, and as a result the attenuation level G of the configuration depends on the binary word A, specifically in such a way that $G = K * A$. K is assumed to be a given proportionality factor. Since in the present exemplary embodiment, the binary word A or the register MR2 has a width of 9 bits, the binary word A can assume $2^9 - 1$ different values, corresponding to the same number of different attenuations. The result for three arbitrary values $A_1, A_2, A_3$ of the binary word A and resultant attenuation levels $G(A_1), G(A_2), G(A_3)$ is in general the following relationship:

$$A_2 = A_1 + 1 \rightarrow G(A_2) > G(A_1)$$
$$A_2 = A_1 - 1 \rightarrow G(A_2) > G(A_1) \quad (4)$$

$$A_3 = A_1 + A_2 \rightarrow G(A_3) \approx G(A_1) + G(A_2) \quad (5)$$

$$A_2 = A_1/2 \rightarrow G(A_2) \approx G(A_1)/2 \quad (6)$$

However, the approximations listed as (5) and (6) pertain exactly if the attenuation level G(A₁) is a multiple (i) of 20*log(2) dB ≈ 6 dB From this the following result is obtained:

$$A_3 = A_1 + A_2 \rightleftharpoons G(A_3) = G(A_1) + G(A_2), \text{ where } G(A_1) = i*6 \text{ dB} \quad (7)$$

$$A_2 = A_1/2 \rightleftharpoons G(A_2) = G(A_1/2), \text{ where } G(A_1) = i*6 \text{ dB} \quad (8)$$

Since furthermore only an approximately linear relationship exists between the attentuation level G and the binary word A in the method introduced, it follows from the addition of two binary words A₁ and A₂ that the sum of attenuation levels G(A₁) and G(A₂) resulting from the binary words A₁ and A₂ is only approximately equal to G(A₁+A₂). Analogously, dividing an arbitrary binary word A₁ in half causes the resulting level of attenuation G(A₁) also to be only approximately halved. In order to ensure that the sum of the attenuation levels G(A₁) and G(A₂) will be greater than or equal to the attenuation level G(A₁+A₂) in every case, an offset value OS, which equals −8 in the exemplary embodiment, is added to the sum of the binary words A₁ and A₂, in accordance with the inequalities (9) and (10).

$$G(A_1) + G(A_2) \geq G(A_1 + A_2) \quad (9)$$

$$A_3 = A_1 + A_2 + OS \rightarrow G(A_3) \leq G(A_2) \quad (10)$$

One possible application for a method and circuit configuration according to the invention is in a hands-free circuit operating on the principle of a balance-type scales. In general, hands-free circuits enable telephoning without using a handset, in other words through a free-standing microphone and a loudspeaker. In order to prevent acoustical coupling between the loudspeaker and the microphone, hands-free telephones can therefore operate only in an alternating speech mode. In other words, only one of the two participants can talk at a given time, while the other listens. In order to achieve this, a hands-free circuit is needed that ascertains who is speaking at a given time and then switches open the applicable channel while attenuating the other one sufficiently. It is important that the loop amplification be kept below 1. If the person speaking changes places, then the circuit must ascertain this immediately and switch over the channels accordingly.

FIG. 2 shows an example of an application in the form of a digital hands-free circuit that has three attentuation members AT1, AT2 and AT3; a hand-free control device CC; an amplifier unit AMP; and automatic gain control AGC. The attenuation member AT1 is connected into the transmission path and is acted upon on the input side by a transmitting-end input signal Xt, which may be a digitized microphone signal. The transmitting-end input signal Xt is attenuated by the attenuation member AT1 as a function of a control signal Mt and is outputted in the form of a transmitting-end output signal Yt. The attenuation member AT2 is correspondingly connected into the receiving path. The attenuation member AT1 is preceded by the amplifier unit AMP, which in turn is preceded by the attenuation member AT3. The attenuation member AT3 is controlled by means of a signal Mv. The signal My, like a signal Mk, is generated by the amplification control unit AGC, which derives both signals Mv and Mk from an output signal of the amplification unit AMP. A receiving-end input signal Xr is located at the input of the attenuation member AT2, is attenuated as a function of a control signal Mr and is output in the form of a transmitting-end output signal Yr. The control signals Mt and Mr are generated by the hands-free control device CC after the evaluation of the transmitting-end and receiving-end input signals Xt and Xr and of the signal Mk. The attenuation members AT1, AT2, and AT3 include not only a control logic but they each also contain one computation unit and one register, which are constructed identically to the computation unit CU and the register MR2 of the exemplary embodiment of FIG. 1. Registers corresponding to the registers MR1 and MR3 were dispensed with, because in the present exemplary application it has been assumed that circuit units on the input and output side of the attenuation members AT1, AT2 and AT3 retain the various binary words for an adequately long period of time. In this connection it should be noted that it is also optionally possible to omit the register MR2, for instance if the hands-free control device CC or the automatic gain control AGC has the capability of storing binary words in memory and splitting them into various sub-binary words.

The hands-free control device CC controls the attenuation members AT1 and AT2 by outputting corresponding sub-binary words in the form of the control signals Mt and Mr. If speech in the transmission direction is recognized, then the hands-free control device CC sets the attenuation member AT1 to a minimum attenuation level, preferably 0 bB, and sets the attenuation member AT2 to a maximal attenuation level. Upon recognition of speech in the receiving direction, the attenuation member AT1 is set to maximal attenuation and the attenuation member AT2 is set to minimal attenuation. As soon as no speech in either the transmitting or the receiving direction is recognized, both attenuation members AT1 and AT2 are put in a so-called idle state. In other words, a value located between the minimal and the maximal attenuation level is set for both attenuation members AT1 and AT2. The transition to the idle state takes place incrementally by increasing the attenuation in the transmitting direction and decreasing it in the receiving direction. The transition to the idle state also takes place virtually logarithmically, which is appropriate from the standpoint of human hearing. In turn, it is important that the loop amplification in every phase of the transition never be allowed to become greater than 1.

The automatic regulation of the microphone amplification is intended to compensate for differences in loudspeakers, which may, for instance, be due to variations in the distance of the speaker from the hands-free microphone. The automatic gain control AGC, the attenuation AT3 and the amplifier unit AMP are provided for that purpose. The signal Mv is readjusted by the automatic gain control AGC in such a way that the level of the output signal of the amplifier unit AMP is approximately constant on average within a given period of observation. The transmitting-end input signal Xt is correspondingly increased to a variable extent. The resulting level of amplification of the series circuit including the attenuation member AT3 and the amplifier unit AMP is 0 dB at a minimum and 12 dB, for instance, at a maximum. This is attained, for example, by providing that the amplifier unit AMP has a constant amplification level of 12 dB and the attenuation member AT3 has an adjustable attentuation of 12 dB to 0 dB. In the case of the exemplary embodiment of FIG. 1, the following apply:

$$G(Mv=64)=12 \text{ dB} \quad (11)$$

$$G(Mv=0)=0 \text{ dB} \quad (12)$$

The readjustment of the attenuation member AT3 is effected by one or more successive operations of addition or subtraction performed upon the signal My. The signal Mv assumes values only in the range from 0 to 64. In order to ensure that the loop amplification does not become greater than 1, the amplification of the receiving-end input signal Xt must be taken into account in the setting of the gain by the attenuation members AT1 and AT2. The following equation must be satisfied:

$$G(Mr)+G(Mt)=G(MH)-G(Mv)+12 \text{ dB} \quad (13)$$

Equation (13) can be converted as follows:

$$G(Mr)+G(Mt)=G(MH') \quad (14)$$

$$G(MH')=G(MH)+G(Mk) \quad (15)$$

$$G(Mk)=12 \text{ dB}-G(Mv) \quad (16)$$

In the case of the idle state, the following applies:

$$G(MI)=\tfrac{1}{2}G(MH') \quad (17)$$

G(Mt), G(Mr) and G(Mv) are the attenuation levels that are set at the attenuation members AT1, AT2 and AT3 and are dependent on the applicable control signals Mt, Mr and My. The attenuation level G(MH) that is dependent on a signal MH describes the amplitude defined by the hands-free control device CC, between minimal and maximal attenuation for the attenuation members AT1 and AT2, in the case where the attenuation level G(Mv)=12 dB. The value of the signal MH can be considered to be given. In contrast, the attenuation level G(MH') takes into account the resultant level of amplification of the attenuation member AT3 and the amplifier unit AMP. It is therefore the amplitude that is significant for the hands-free control device CC. The attenuation level G(MH') is obtained from adding together the attenuation level G(MH) and the attenuation level G(Mk). The attenuation level G(Mk), that is dependent on the signal Mk, corresponds to the negative amplification level by which the attenuation level G(MH) must be readjusted. In the idle state, the attenuation levels (G(Mt) and G(Mr) are each equal to half the attenuation level G(MH'). In this case, the control signals Mt and Mr are equal to the value of the signal MI. Based on equations (14) through (17), the following are obtained for the various signals MH', MH, MK, MI and Mr:

$$Mr+Mt+OS=MH' \quad (18)$$

$$MH'=MH+Mk-OS \quad (19)$$

$$Mk=64-Mv \quad (20)$$

$$MI=0.5*MH' \quad (21)$$

From the signals MH and Mk, the hands-free control device CC calculates the signals MH' and MI as follows: If speech in the transmitting direction is recognized, then the hands-free control device sets the control signal Mt equal to 0 and the control signal Mr equal to the signal MH'. Upon speech in the receiving direction, the control signal Mt becomes equal to the signal MH' and the control signal Mr becomes equal to 0. As soon as speech is recognized in neither the transmitting nor the receiving direction, both attenuation members AT1 and AT2 are placed in the idle state. To that end, the value of the control signal of the non-attenuated direction is increased, for instance by continuous addition of 1, until this value is equal to the signal MI. The value of the control signal of the other direction is calculated from equation (18).

The offset value OS in equation (18) assures that during the transition to the idle state and in the idle state itself, the sum of attenuations of the two attenuation members AT1 and AT2 can never become less than the required amplitude. The offset value OS, in accordance with equation (19), has the effect of increasing the specified amplitude at least by the amount by which the transmitting-end input signal Xt is increased by the automatic gain control AGC.

The splitting of the binary word A shown in FIG. 1 achieves the effect of ensuring that the variation of the attenuation level is no greater than 0.75 dB, which is especially advantageous for an application in the audio field, because attenuation variations of less than or equal to 0.75 dB are not perceived by human hearing. Moreover, there is a substantially linear relationship between the binary word A and the attenuation level. As a result, in order to simultaneously increase and decrease the attenuations of the two attenuation members AT1 and AT2, the applicable control signal Mt or Mr need only be raised or lowered by a certain value. To this end, only simple addition or subtraction operations are necessary, which only entail slight effort and expense for circuitry.

Besides the low expense for circuitry, which requires little surface area with integrated circuitry technology, the advantages of the invention are, above all, the ease with which the applicable attenuation can be adjusted using easily accomplished addition and subtraction operations, and the fact that there is an unambiguous relationship between the binary word or signal that determines the attenuation and the binary word or signal to be attenuated. This assures that even after an arbitrary number of readjustments, the state of the circuit configuration is unambiguously defined.

I claim:

1. A method for non-linear linkage of a first and second binary word stored in a respective first and second binary register, the method which comprises the steps of:

partitioning the second binary word in the second binary register into n sub-binary words, each sub-binary word having a number of sub-binary bits stored in respective places in a respective sub-binary register, each sub-binary word having a respective sub-binary value, and wherein each sub-binary register is associated with a respective shift register, performing a first shifting step in a first shift register by shifting the first binary word to the right a number of places equal to the sub-binary value stored in the first sub-binary register, and subsequently adding in a first adder the unchanged first binary word to the shifted word;

performing n−2 further shifting steps in further shift registers by further shifting the outcome of the addition of the preceding shifting step to the right one place and next shifting the outcome of the addition a number of places corresponding to the sub-binary value of the sub-binary word in each respective associated sub-binary register in respective method steps, and adding in further adders the unchanged first binary word thereto, wherein n is a positive integer equal to at least 2, and next performing a final shifting step by shifting in a last shift register the outcome of the addition of the preceding shifting step to the right one place and next shifting the outcome of the addition a number of places according to the sub-binary value of the sub-binary word associated with the final shift register, and finally transferring the outcome of the last shifting step to an output of the final shift register.

2. The method according to claim 1, which comprises:

forming at least one of the sub-binary words as a "one" bit of the second binary word;

placing only "one" bits of the second binary word in sub-binary words having more than one bit; and associating the sub-binary words having increasing significance within the second binary word with the place numbers in the order of the associated shifting steps.

3. The method according to claim 2, which comprises:

placing two bits in a sub-binary word having the least significance within the second binary word, and setting the number of bits in all other sub-binary words having increasing significance within the second binary word, beginning at 1, each equal to a power of 2.

4. The method according to claim 1, which comprises shifting the first binary word to the right by one further place in the first shifting step.

5. A circuit configuration for non-linear linkage of a first and second binary word, comprising:

a first register into which the first binary word is written, a second register into which the second binary word is written, said second register divided into n subregisters including a first subregister, further subregisters and a last subregister, and a computation unit connected to said first register and to said n subregisters, shifting means in said computation unit for shifting binary words stored in said first binary register, wherein n is a positive integer equal to at least 2, and said computation unit initially shifting the first binary word to the right a number of places according to a sub-binary value stored in said first subregister and adding the first binary word thereto, said computation unit thereupon shifting the respective preceding outcome of addition to the right one place and a number of places according to a sub-binary value stored respectively in said further subregisters n−2 times in succession and adding the first binary word thereto, and said shifting means in said computation unit finally shifting a final outcome of addition to the right one place and a number of places stored in said last subregister, the word stored in said last subregister representing the non-linear linkage of said first and second binary word.

6. The circuit configuration according to claim 5, including connecting means connecting said subregisters with said shifting means for shifting contents of said first register, wherein each of said subregisters in said second register has a corresponding significance.

7. The circuit configuration according to claim 6, wherein said subregister having the least significance is two bits wide, and the remaining subregisters beginning with "1" have increasing significance increasing with powers of 2.

8. The circuit configuration according to claim 5, wherein said computation unit initially shifts the first binary word to the right by one further place.

9. The circuit configuration according to claim 5, wherein said computation unit includes n shift registers and adders through which said n shift registers are connected in series, and the first binary word is delivered to said adders and to a first one of said shift registers.

* * * * *